(12) United States Patent
Takemura

(10) Patent No.: US 9,230,683 B2
(45) Date of Patent: Jan. 5, 2016

(54) SEMICONDUCTOR DEVICE AND DRIVING METHOD THEREOF

(71) Applicant: Semiconductor Energy Laboratory Co., Ltd., Atsugi-shi, Kanagawa-ken (JP)

(72) Inventor: Yasuhiko Takemura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 134 days.

(21) Appl. No.: 13/864,476

(22) Filed: Apr. 17, 2013

(65) Prior Publication Data

US 2013/0286757 A1    Oct. 31, 2013

(30) Foreign Application Priority Data

Apr. 25, 2012    (JP) .................... 2012-100190

(51) Int. Cl.
*G11C 29/12*    (2006.01)
*G11C 29/04*    (2006.01)
*G11C 29/52*    (2006.01)
(Continued)

(52) U.S. Cl.
CPC ............ *G11C 29/04* (2013.01); *G06F 11/1004* (2013.01); *G11C 11/405* (2013.01); *G11C 29/52* (2013.01); *G11C 16/045* (2013.01); *G11C 16/0416* (2013.01); *G11C 16/0433* (2013.01); *G11C 2029/0409* (2013.01); *G11C 2029/0411* (2013.01)

(58) Field of Classification Search
CPC ....................................... G11C 29/12
USPC .................................................. 365/185.09
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Min Huang
(74) *Attorney, Agent, or Firm* — Fish & Richardson P.C.

(57) ABSTRACT

An error of stored data is detected with high accuracy. Data (e.g., a remainder in a CRC) used for detecting an error is stored in a memory in which an error is unlikely to occur. Specifically, the following semiconductor device is used: a memory element including a plurality of transistors, a capacitor, and a data storage portion is provided in a matrix; the data storage portion includes one of a source and a drain of one of the plurality of transistors, a gate of another one of the plurality of transistors, and one electrode of the capacitor; a semiconductor layer including a channel of the transistor, the one of the source and the drain of which is connected to the data storage portion, has a band gap of 2.8 eV or more, or 3.2 eV or more; and the data storage portion stores data for detecting an error.

18 Claims, 6 Drawing Sheets

(51) Int. Cl.
G11C 11/405 (2006.01)
G06F 11/10 (2006.01)
G11C 16/04 (2006.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,735,110 B1 | 5/2004 | Lesea | |
| 6,809,957 B2 | 10/2004 | Lesea | |
| 6,879,504 B1* | 4/2005 | Lien et al. | 365/49.1 |
| 6,914,804 B2 | 7/2005 | Lesea | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,310,757 B2 | 12/2007 | Ngo et al. | |
| 7,319,253 B2 | 1/2008 | Sidhu et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,465,971 B2 | 12/2008 | Sidhu et al. | |
| 7,468,304 B2 | 12/2008 | Kaji et al. | |
| 7,501,293 B2 | 3/2009 | Ito et al. | |
| 7,577,055 B2 | 8/2009 | Ngo et al. | |
| 7,620,876 B2 | 11/2009 | Lewis et al. | |
| 7,674,650 B2 | 3/2010 | Akimoto et al. | |
| 7,702,978 B2 | 4/2010 | Lewis et al. | |
| 7,732,819 B2 | 6/2010 | Akimoto et al. | |
| 7,907,460 B2 | 3/2011 | Ngo et al. | |
| 7,979,826 B1* | 7/2011 | Trimberger | 716/117 |
| 8,130,574 B2 | 3/2012 | Ngo et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0245238 A1* | 11/2006 | Turner | 365/149 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0095396 A1* | 4/2011 | Fumitake | 257/532 |
| 2011/0134709 A1* | 6/2011 | Kuroki et al. | 365/189.07 |
| 2011/0175646 A1* | 7/2011 | Takemura et al. | 326/44 |
| 2012/0166908 A1* | 6/2012 | Yamaga | 714/755 |
| 2012/0273858 A1* | 11/2012 | Takahashi | 257/296 |
| 2012/0293200 A1* | 11/2012 | Takemura | 326/38 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-172214 A | 9/2011 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m= 3, 4, and 5), InGaO3(ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02: Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06: Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Miyasaka.M, "SUFTLA Flexible Microelectronics on Their Way to Business", SID Digest '07: SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08: SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTS", IDW '09: Proceedigs of the 16th International Display Workshops, 2009, pp. 689-692.

Asaoka.Y et al., "29.1: Polarizer-Free Reflective LCD Combined With Ultra Low-Power Driving Technology", SID Digest '09: SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09: SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09: SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Cho.D et al., "21.2:AL and SN-Doped Zinc Indium Oxide Thin Film Transistors for AMOLED Back-Plane", SID Digest '09: SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09: SID International Symposium Digest of Technical Papers, May 31, 2009, pp. 184-187.

Ohara.H et al., "21.3:4.0 In. QVGA AMOLED Display Using In-Ga-Zn-Oxide TFTS With a Novel Passivation Layer", SID Digest '09: SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09: SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM NEWSLETTER, Mar. 1, 1995, vol. 150, pp. 1-4.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

Janotti.A et al., "Native Point Defects In ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys, Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08: SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AMOLED Display", SID Digest '08: SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08: Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

SEMICONDUCTOR DEVICE AND DRIVING METHOD THEREOF

BACKGROUND OF THE INVENTION

1. Field of the Invention

The present invention relates to a semiconductor device. In this specification, the semiconductor device refers to a semiconductor element itself or a device including the semiconductor element, and an example of such a semiconductor element is a thin film transistor. Therefore, a liquid crystal display device, a memory device, and the like are also included in the category of the semiconductor device.

2. Description of the Related Art

A programmable semiconductor device is a kind of semiconductor device. The programmable semiconductor device includes a logic circuit which can be reconfigured by a user, and such a semiconductor device is called, for example, a programmable logic device (PLD).

An example of PLD is a semiconductor device having the following structure: a plurality of logic circuits are provided, and a connection between the logic circuits or the function of the logic circuits can be changed with data (called configuration data) stored in a memory unit (called a configuration memory), which enables a user to change the circuit design. As the configuration data, for example, data stored in a look-up table (LUT) is used.

A static random access memory (SRAM) is generally used as the configuration memory; however, it has a problem in that data inversion (upset) is likely to occur due to soft errors. In order to detect such an error, it is necessary to regularly read out data from a memory element connected to each program element in a programmable semiconductor device. An example of such detection of errors is a cyclic redundancy check (CRC), which allows detection of the data upset (see Patent Document 1, for example).

REFERENCE

Patent Document

[Patent Document 1] U.S. Pat. No. 8,130,574

SUMMARY OF THE INVENTION

In a programmable semiconductor device (a semiconductor device whose circuit design can be changed by a user) including a volatile memory (such as an SRAM), when configuration data is loaded in configuration, arithmetic operation is performed on the configuration data so that a remainder is calculated and stored. Then, during or after the configuration and during a period in which a user mode is executed, configuration data scattered in the semiconductor device is read out and subjected to a CRC on the basis of the remainder.

However, since the remainder is stored in the volatile memory (such as an SRAM), an expected value (data based on the remainder) might be changed due to soft errors. Therefore, in the case where an error is detected, the configuration needs to be performed again.

An object of one embodiment of the present invention is to provide a semiconductor device in which a CRC is performed without soft errors. In other words, an object of one embodiment of the present invention is to provide a semiconductor device in which an error is detected with high accuracy.

Another object of one embodiment of the present invention is to provide a method for driving a semiconductor device in which a CRC is performed without soft errors. In other words, another object of one embodiment of the present invention is to provide a method for driving a semiconductor device in which an error is detected with high accuracy.

One embodiment of the present invention is a semiconductor device in which a memory element including a plurality of transistors, a capacitor, and a data storage portion is provided in a matrix. The data storage portion includes one of a source and a drain of one of the plurality of transistors, a gate of another one of the plurality of transistors, and one electrode of the capacitor. A semiconductor layer including a channel of the transistor, the one of the source and the drain of which is connected to the data storage portion, has a band gap of 2.8 eV or more, or 3.2 eV or more. The data storage portion stores data for detecting an error.

In the semiconductor device with the above structure, it is preferable that the error detection be a cyclic redundancy check and the data for detecting an error be a remainder used for the cyclic redundancy check.

In the semiconductor device with the above structure, the semiconductor layer including a channel of the transistor, the one of the source and the drain of which is connected to the data storage portion, preferably has a thickness of 20 nm or less.

Another embodiment of the present invention is a method for driving a semiconductor device, in which an error is detected by a cyclic redundancy check with use of a configuration memory and a memory storing a remainder, comprising the steps of detecting an error of an i-th row with use of the remainder calculated in advance; performing processing of an i+1-th row if there is no error in the i-th row; writing data to be input to the i-th row which is stored in the configuration memory if there is an error in the i-th row; and repeating the error detection and the data writing until no error is detected. The remainder used in the cyclic redundancy check is stored in a memory element having a lower error rate than the configuration memory.

In the method for driving the semiconductor device with the above structure, in the case where an error is detected with use of the remainder a predetermined number of times or more, the remainder may be calculated again.

In the method for driving the semiconductor device with the above structure, a divisor used for calculating the remainder is preferably stored in a ROM.

In the method for driving the semiconductor device with the above structure, the memory element with a low error rate may be the memory element provided in the semiconductor device with the above structure.

It is possible to provide a semiconductor device in which a CRC can be performed without soft errors, namely, a semiconductor device in which an error is detected with high accuracy.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

First, description is made on a configuration of a memory element which can be used for a semiconductor device of one embodiment of the present invention, and the operation thereof. Then, description is made on a CRC which can be used in a method for driving a semiconductor device of one embodiment of the present invention.

(Embodiment 1)

A configuration of a memory element which can be used for a semiconductor device of one embodiment of the present invention, and the operation thereof will be described.

Note that the description in this embodiment is made focusing on one memory element; however, in an actual semiconductor device, a plurality of memory elements are arranged in a matrix.

Figure 1A:
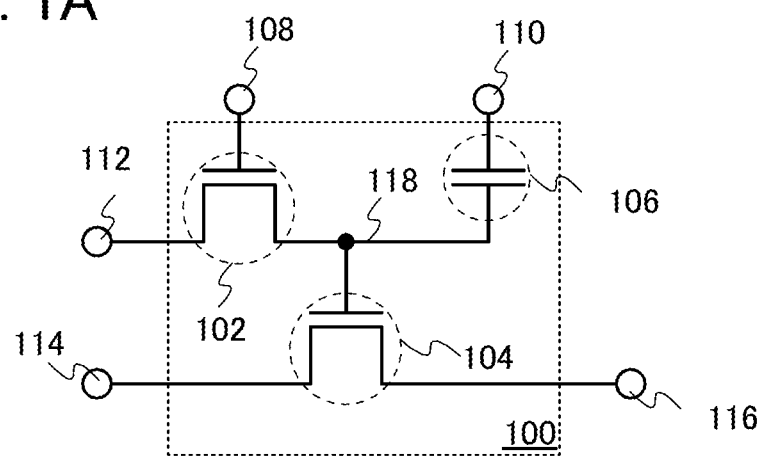
FIGS. 1A and 1B each illustrate a memory element of a semiconductor device which is one embodiment of the present invention.

FIG. 1A illustrates an example of the configuration of the memory element that can be used for the semiconductor device of one embodiment of the present invention. A memory element 100 illustrated in FIG. 1A includes a first transistor 102, a second transistor 104, a capacitor 106, and a data storage portion 118, and is electrically connected to a first terminal 108, a second terminal 110, a third terminal 112, a fourth terminal 114, and a fifth terminal 116.

One of a source and a drain of the first transistor 102 is electrically connected to the third terminal 112. The other of the source and the drain of the first transistor 102 is electrically connected to a first electrode of the capacitor 106 and a gate of the second transistor 104. A gate of the first transistor 102 is electrically connected to the first terminal 108.

One of a source and a drain of the second transistor 104 is electrically connected to the fourth terminal 114. The other of the source and the drain of the second transistor 104 is electrically connected to the fifth terminal 116.

A second electrode of the capacitor 106 is electrically connected to the second terminal 110. Note that the capacitor 106 preferably has a capacitance of 1 fF (femto farad) or more.

The data storage portion 118 is formed in an area in which the other of the source and the drain of the first transistor 102, the first electrode of the capacitor 106, and the gate of the second transistor 104 are electrically connected to each other.

Any transistor having low off-state current can be used as the first transistor 102. A channel formation region of the first transistor 102 is preferably a thin semiconductor layer, and more preferably a semiconductor layer with a thickness of 20 nm or less. By using such a thin semiconductor layer for the channel formation region, the amount of charge generated by a nuclear reaction by irradiation with high energy neutrons can be reduced to about 1/10 or less of that in a bulk semiconductor. The use of a large band gap material for the semiconductor layer including a channel allows a further reduction in the amount of charge generated. An example of such a large band gap material is an oxide semiconductor.

For example, in a semiconductor with a band gap of 3.2 eV (e.g., an oxide semiconductor), the amount of charge generated per unit length in an area through which a particles produced by the nuclear reaction pass is about 1/3 of that in a semiconductor with a band gap of 1.1 eV (e.g., silicon). It is generally said that a charge of several hundreds of femto coulombs (fC) is generated in a nuclear reaction in silicon. In a semiconductor with a band gap of 3.2 eV and a thickness of 20 nm, the amount of charge generated is less than 1 fC.

Thus, when a semiconductor layer serving as the channel formation region of the first transistor 102 is formed thin using a large band gap material, the first transistor 102 has sufficient stability against a nuclear reaction occurring due to irradiation with high energy neutrons, whereby the data storage portion 118 has high storage capability.

Note that the semiconductor layer serving as the channel formation region of the first transistor 102 preferably has no PN junction, and the single semiconductor layer preferably includes a single transistor (channel). This is because in the case where the semiconductor layer has PN junction and channels of a plurality of transistors are provided in the semiconductor layer (that is, the single semiconductor layer includes a plurality of transistors), all the transistors in the semiconductor layer might be affected by a nuclear reaction due to parasitic bipolar effect.

Any transistor having a switching function can be used as the second transistor 104. For example, the second transistor 104 may be a transistor in which a channel is formed in a silicon substrate. The second transistor 104 may be either a p-channel transistor or an n-channel transistor.

A signal is input to the first terminal 108 and the third terminal 112 at least when data is written to the data storage portion 118. Data for detecting an error is input to the third terminal 112. A memory subjected to error detection is, for example, the one included in a configuration memory 400 illustrated in FIGS. 4A and 4B. A signal is input to the second terminal 110 at least when data is read out from the data storage portion 118. A signal is output from the fifth terminal 116 at least when data is read out from the data storage portion 118. Note that the timing of inputting and outputting signals to and from the first terminal 108, the second terminal 110, the third terminal 112, the fourth terminal 114, and the fifth terminal 116 is not limited to the above.

Next, operation of the memory element 100 illustrated in FIG. 1A will be described. When data is written to the memory element 100, the potential of the first terminal 108 is controlled so that the first transistor 102 is turned on, and the third terminal 112 is controlled to have a potential of data to be written. In the case where the first transistor 102 is an n-channel transistor as illustrated in FIG. 1A, it is turned on when the first terminal 108 has a high potential; in the case where the first transistor 102 is a p-channel transistor, it is turned on when the first terminal 108 has a low potential.

By controlling the potentials in the above manner, the potential of the data storage portion 118 becomes a potential corresponding to the potential of the third terminal 112, preferably, a potential equal to the potential of the third terminal 112. That is, data is written to the data storage portion 118. After the data is written to the data storage portion 118, the potential of the first terminal 108 is controlled so that the first transistor 102 is turned off, whereby the data is stored in the data storage portion 118. Since a transistor with a low off-state current is used as the first transistor 102, the potential of the data storage portion 118 is kept for a sufficient time (10 ms or more). If the data is stored in the data storage portion 118 for a longer time, refresh operation may be performed.

When data is read out from the memory element 100, the potential of the second terminal 110 is set to a potential to be read out, and the data of the data storage portion 118 is determined with the on-resistance of the second transistor 104.

For example, in the case where the second transistor 104 is an n-channel transistor, the second transistor 104 has a low on-resistance when the data storage portion 118 has a high potential, so that a signal input to the fourth terminal 114 is transmitted to the fifth terminal 116. On the other hand, the second transistor 104 has a high on-resistance when the data storage portion 118 has a low potential; therefore, a signal input to the fourth terminal 114 is not transmitted to the fifth terminal 116.

In the case where the second transistor 104 is a p-channel transistor, the second transistor 104 has a high on-resistance when the data storage portion 118 has a high potential, and thus a signal input to the fourth terminal 114 is not transmitted to the fifth terminal 116. On the other hand, the second transistor 104 has a low on-resistance when the data storage portion 118 has a low potential, so that a signal input to the fourth terminal 114 is transmitted to the fifth terminal 116.

Note that the potential of the third terminal 112 is preferably higher than or equal to the highest potential value of the data storage portion 118 or lower than or equal to the lowest potential value of the data storage portion 118. For example, the high potential of the data storage portion 118 is +1 V and the low potential thereof is 0 V.

Figure 1B:
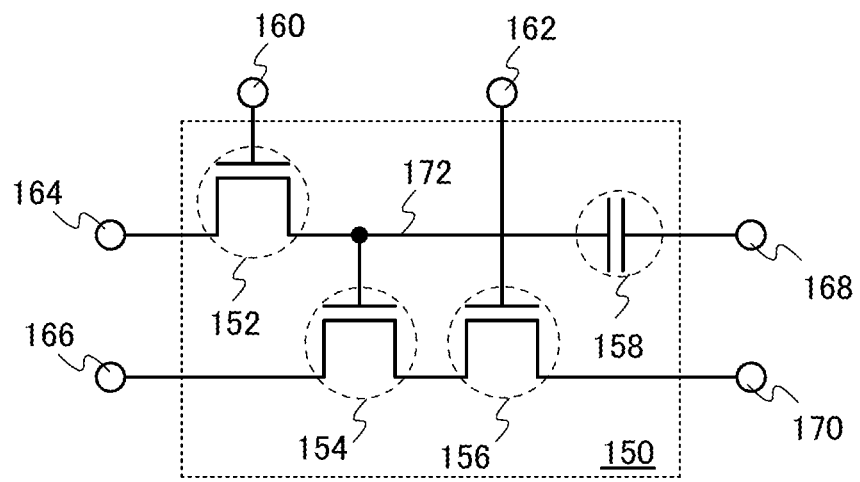

FIG. 1B illustrates an example of the configuration of the memory element that can be used for the semiconductor device of one embodiment of the present invention, which is different from that of FIG. 1A. A memory element 150 illustrated in FIG. 1B includes a first transistor 152, a second transistor 154, a third transistor 156, a capacitor 158, and a data storage portion 172, and is electrically connected to a first terminal 160, a second terminal 162, a third terminal 164, a fourth terminal 166, a fifth terminal 168, and a sixth terminal 170.

The first transistor 152 has a structure similar to that of the first transistor 102 in FIG. 1A. The second transistor 154 and the third transistor 156 have a structure similar to that of the second transistor 104 in FIG. 1A. The data storage portion 172 is formed in an area in which one of a source and a drain of the first transistor 152, a first electrode of the capacitor 158, and a gate of the second transistor 154 are electrically connected to each other.

A signal is input to the first terminal 160 and the third terminal 164 at least when data is written to the data storage portion 172. Data for detecting an error is input to the third terminal 164. A memory subjected to error detection is, for example, the one included in the configuration memory 400 illustrated in FIGS. 4A and 4B. A signal is input to the second terminal 162 at least when data is read out from the data storage portion 172. A signal is output from the sixth terminal 170 at least when data is read out from the data storage portion 172. Note that the timing of inputting and outputting signals to and from the first terminal 160, the second terminal 162, the third terminal 164, the fourth terminal 166, the fifth terminal 168, and the sixth terminal 170 is not limited to the above.

Next, operation of the memory element 150 illustrated in FIG. 1B will be described. Data is written to the memory element 150 in a manner similar to that in the case where data is written to the memory element 100 in FIG. 1A; thus, the above description is referred to and description is omitted here.

When data is read out from the memory element 150, the potential of the second terminal 162 is controlled so that the third transistor 156 is turned on. Data of the data storage portion 172 can be determined because the on-resistance of the second transistor 154 changes with the potential of the data storage portion 172.

In the memory element 150 in FIG. 1B, the control of the potential of the fifth terminal 168 allows the potential of the data storage portion 172 to be largely varied.

For example, description is made on the case where the second transistor 154 is an n-channel transistor and the capacitance of the capacitor 158 is equal to the capacitance (gate capacitance) of the second transistor 154 which is on. The potential of the third terminal 164 is set to +1 V and the potential of the fifth terminal 168 is set to 0 V, whereby data having a high potential is written to the data storage portion 172. In a period during which the data of the data storage portion 172 is kept, the fifth terminal 168 is set to +1 V. Then, the data storage portion 172 has a potential of +1.5 V. Note that the potential of the fourth terminal 166 is set to +2.0 V.

In the case where the second transistor 154 is a p-channel transistor and the capacitance of the capacitor 158 is equal to the capacitance of the second transistor 154 which is on, the data storage portion 172 has a potential of +2 V when data having a high potential is written to the data storage portion 172 in the above manner.

(Embodiment 2)

Figure 2:
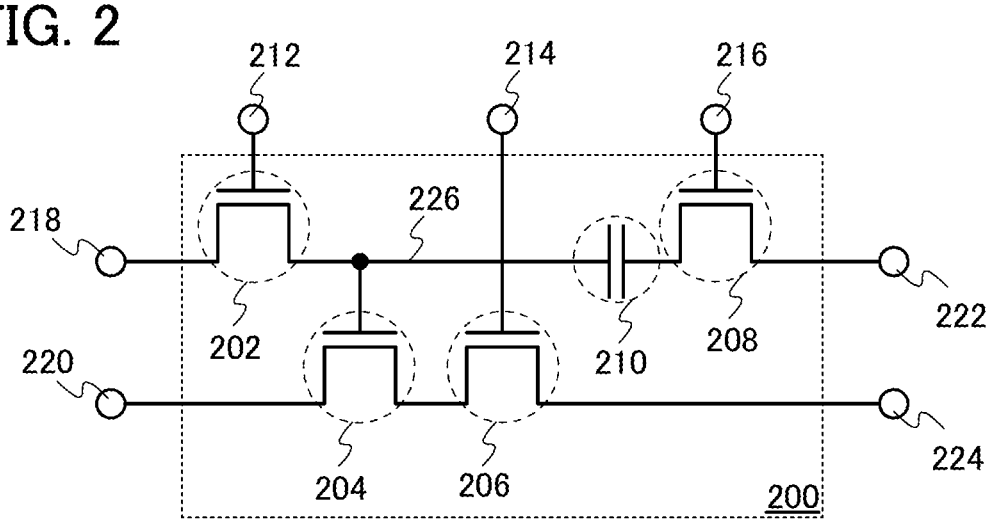
FIG. 2 illustrates a memory element of a semiconductor device which is one embodiment of the present invention.

FIG. 2 illustrates an example of the configuration of the memory element that can be used for the semiconductor device of one embodiment of the present invention, which is different from those of FIGS. 1A and 1B. A memory element 200 illustrated in FIG. 2 includes a first transistor 202, a second transistor 204, a third transistor 206, a fourth transistor 208, a capacitor 210, and a data storage portion 226, and is electrically connected to a first terminal 212, a second terminal 214, a third terminal 216, a fourth terminal 218, a fifth terminal 220, a sixth terminal 222, and a seventh terminal 224.

The first transistor 202 has a structure similar to that of the first transistor 102 in FIG. 1A. The fourth transistor 208 has a structure similar to that of the first transistor 102 or the second transistor 104 in FIG. 1A. The second transistor 204 and the third transistor 206 have a structure similar to that of the second transistor 104 in FIG. 1A. The data storage portion 226 is formed in an area in which one of a source and a drain of the first transistor 202, a first electrode of the capacitor 210, and a gate of the second transistor 204 are electrically connected to each other.

A signal is input to the first terminal 212, the third terminal 216, and the fourth terminal 218 at least when data is written to the data storage portion 226. Data for detecting an error is input to the fourth terminal 218. A memory subjected to error detection is, for example, the one included in the configuration memory 400 illustrated in FIGS. 4A and 4B. A signal is input to the second terminal 214 at least when data is read out from the data storage portion 226. A signal is output from the seventh terminal 224 at least when data is read out from the data storage portion 226. Note that the timing of inputting and outputting signals to and from the first terminal 212, the second terminal 214, the third terminal 216, the fourth terminal 218, the fifth terminal 220, the sixth terminal 222, and the seventh terminal 224 is not limited to the above.

The memory element 200 illustrated in FIG. 2 includes the fourth transistor 208. When data is written to an arbitrary row and other rows, the fourth transistor 208 is synchronized with the first transistor 202, in other words, the fourth transistor 208 and the first transistor 202 are turned on/off at the same timing, which prevents a decrease in the potential of the data storage portion 226 in a period during which data is written to the other rows. For example, the fourth transistor 208 and the first transistor 202 are turned off when data is written to the other rows.

After the data writing is completed, the fourth transistor 208 is turned on while the first transistor 202 is kept off, and the potential of the sixth terminal 222 is set to an appropriate value. Thus, as in the memory element in FIG. 1B, the potential of the data storage portion 226 can be changed.

Note that the other configuration of the memory element 200 in FIG. 2 is similar to those of the memory element 100 in FIG. 1A and the memory element 150 in FIG. 1B; thus, the description in Embodiment 1 is referred to and description is omitted here.

(Embodiment 3)

In the memory element 100 and the memory element 150 described in Embodiment 1 and the memory element 200 described in Embodiment 2, it is necessary to make a potential difference between at least two terminals (precharge operation) before data is read out. For example, in the memory element 100 in FIG. 1A, the fourth terminal 114 and the fifth terminal 116 need to have potentials different from each other.

Figure 3A:
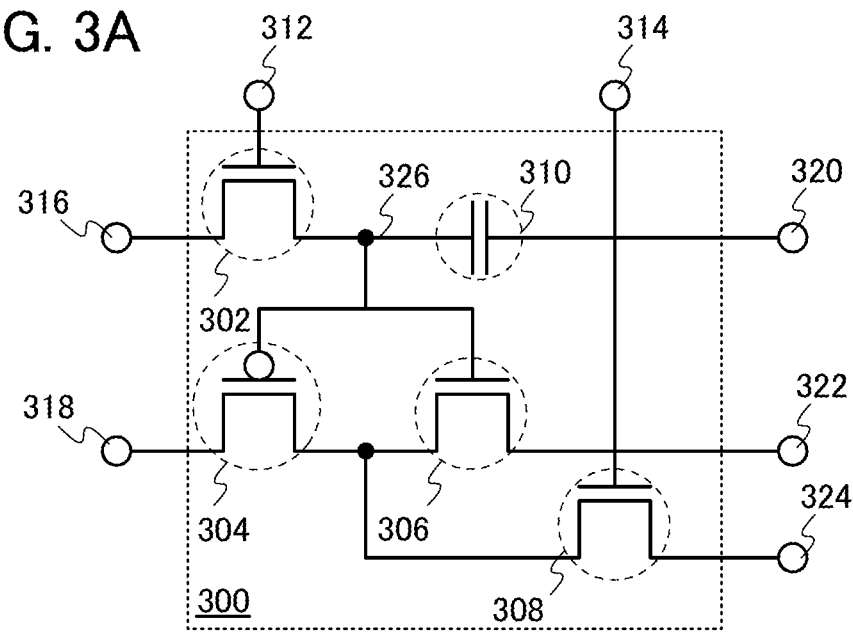
FIGS. 3A and 3B each illustrate a memory element of a semiconductor device which is one embodiment of the present invention.
Figure 3B:
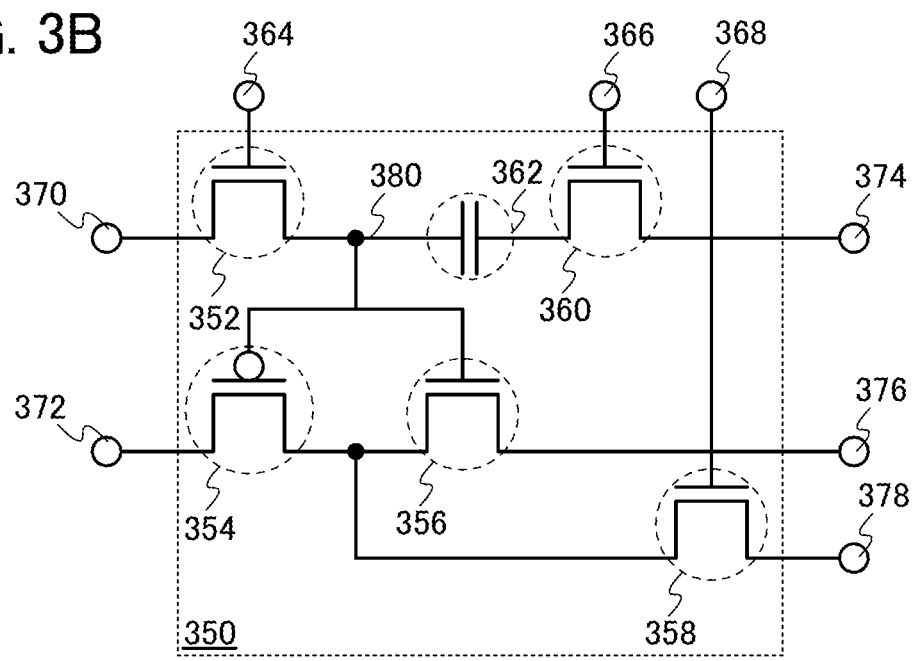

Next, description is made on an example of the configuration of the memory element that can be used for the semiconductor device of one embodiment of the present invention, in which precharge operation is unnecessary (see FIGS. 3A and 3B).

FIG. 3A illustrates an example of the configuration of the memory element that can be used for the semiconductor device of one embodiment of the present invention, in which precharge operation is unnecessary. A memory element 300 illustrated in FIG. 3A includes a first transistor 302, a second transistor 304, a third transistor 306, a fourth transistor 308, a capacitor 310, and a data storage portion 326, and is electrically connected to a first terminal 312, a second terminal 314, a third terminal 316, a fourth terminal 318, a fifth terminal 320, a sixth terminal 322, and a seventh terminal 324.

The first transistor 302 has a structure similar to that of the first transistor 102 in FIG. 1A. The second transistor 304, the third transistor 306, and the fourth transistor 308 have a structure similar to that of the second transistor 104 in FIG. 1A. Note that the second transistor 304 and the third transistor 306 have different conductivity types as described later. The data storage portion 326 is formed in an area in which one of a source and a drain of the first transistor 302, a first electrode of the capacitor 310, a gate of the second transistor 304, and a gate of the third transistor 306 are electrically connected to each other.

A signal is input to the first terminal 312 and the third terminal 316 at least when data is written to the data storage portion 326. Data for detecting an error is input to the third terminal 316. A memory subjected to error detection is, for example, the one included in the configuration memory 400 illustrated in FIGS. 4A and 4B. A signal is input to the second terminal 314 at least when data is read out from the data storage portion 326. A signal is output from the seventh terminal 324 at least when data is read out from the data storage portion 326. Note that the timing of inputting and outputting signals to and from the first terminal 312, the second terminal 314, the third terminal 316, the fifth terminal 320, and the seventh terminal 324 is not limited to the above.

Note that the fourth terminal 318 is electrically connected to a high potential power source line Vdd and the sixth terminal 322 is electrically connected to a low potential power source line Vss. Alternatively, the fourth terminal 318 and the sixth terminal 322 may be electrically connected to the low potential power source line Vss and the high potential power source line Vdd, respectively.

In the memory element 300 illustrated in FIG. 3A, an inverter is configured by the second transistor 304 and the third transistor 306. An input of the inverter is electrically connected to the data storage portion 326 and an output of the inverter is electrically connected to one of a source and a drain of the fourth transistor 308. Note that the other of the source and the drain of the fourth transistor 308 is electrically connected to the seventh terminal 324 which corresponds to the fifth terminal 116 in FIG. 1A.

It can also be said that the memory element 300 illustrated in FIG. 3A has the configuration in which the second transistor 304 and the terminal 318 electrically connected to the power source line are added to the memory element 150 illustrated in FIG. 1B.

In the memory element 300 illustrated in FIG. 3A, the potential of the high potential power source line Vdd or the low potential power source line Vss can be output from the seventh terminal 324 without precharge operation, resulting in an increase in reading speed.

Instead of the configuration illustrated in FIG. 3A, a configuration illustrated in FIG. 3B may be employed. FIG. 3B illustrates an example of the configuration of the memory element that can be used for the semiconductor device of one embodiment of the present invention, in which precharge operation is unnecessary. A memory element 350 illustrated in FIG. 3B includes a first transistor 352, a second transistor 354, a third transistor 356, a fourth transistor 358, a fifth transistor 360, a capacitor 362, and a data storage portion 380, and is electrically connected to a first terminal 364, a second terminal 366, a third terminal 368, a fourth terminal 370, a fifth terminal 372, a sixth terminal 374, a seventh terminal 376, and an eighth terminal 378.

The first transistor 352 and the fifth transistor 360 have a structure similar to that of the first transistor 102 in FIG. 1A. The second transistor 354, the third transistor 356, and the fourth transistor 358 have a structure similar to that of the second transistor 104 in FIG. 1A. Note that the second transistor 354 and the third transistor 356 have different conductivity types as those in FIG. 3A. The data storage portion 380 is formed in an area in which one of a source and a drain of the first transistor 352, a first electrode of the capacitor 362, a gate of the second transistor 354, and a gate of the third transistor 356 are electrically connected to each other.

A signal is input to the first terminal 364, the second terminal 366, and the fourth terminal 370 at least when data is written to the data storage portion 380. Data for detecting an error is input to the fourth terminal 370. A memory subjected to error detection is, for example, the one included in the configuration memory 400 illustrated in FIGS. 4A and 4B. A signal is input to the third terminal 368 at least when data is read out from the data storage portion 380. A signal is output from the eighth terminal 378 at least when data is read out from the data storage portion 380. Note that the timing of inputting and outputting signals to and from the first terminal 364, the second terminal 366, the third terminal 368, the fourth terminal 370, and the eighth terminal 378 is not limited to the above.

Note that the fifth terminal 372 is electrically connected to the high potential power source line Vdd and the seventh terminal 376 is electrically connected to the low potential power source line Vss. Alternatively, the fifth terminal 372 and the seventh terminal 376 may be electrically connected to the low potential power source line Vss and the high potential power source line Vdd, respectively.

It can also be said that the memory element 350 illustrated in FIG. 3B has the configuration in which the second transistor 354 and the terminal electrically connected to the power source line are added to the memory element 200 illustrated in FIG. 2.

As described above in Embodiments 1 to 3, there is a variety of examples of configurations of the memory element that can be used for the semiconductor device of one embodiment of the present invention.

In the configurations illustrated in FIGS. 1A and 1B, the second terminal 110 and the fifth terminal 168 control the potentials of the data storage portion 118 and the data storage portion 172 to be largely varied. The same applies to the sixth terminal 222 in FIG. 2, the fifth terminal 320 in FIG. 3A, and the sixth terminal 374 in FIG. 3B.

In the configuration illustrated in FIG. 2, a decrease in the potential of the data storage portion 226 can be prevented by the fourth transistor 208 and the third terminal 216 in a period during which data is written to the other rows, as compared to the configurations illustrated in FIGS. 1A and 1B. The same applies to FIG. 3B.

In the configurations illustrated in FIGS. 3A and 3B, unlike in the configurations illustrated in FIGS. 1A and 1B and FIG. 2, precharge operation is unnecessary.

The memory element that can be used for the semiconductor device of one embodiment of the present invention can be obtained in the aforementioned manner. Note that the memory element that can be used for the semiconductor device of one embodiment of the present invention is not limited to the above examples, and may be modified in a variety of ways without departing from the spirit of the invention.

Note that in one embodiment of the present invention, the aforementioned memory elements only need to be employed for part of the semiconductor device.

(Embodiment 4)

Figure 4A:
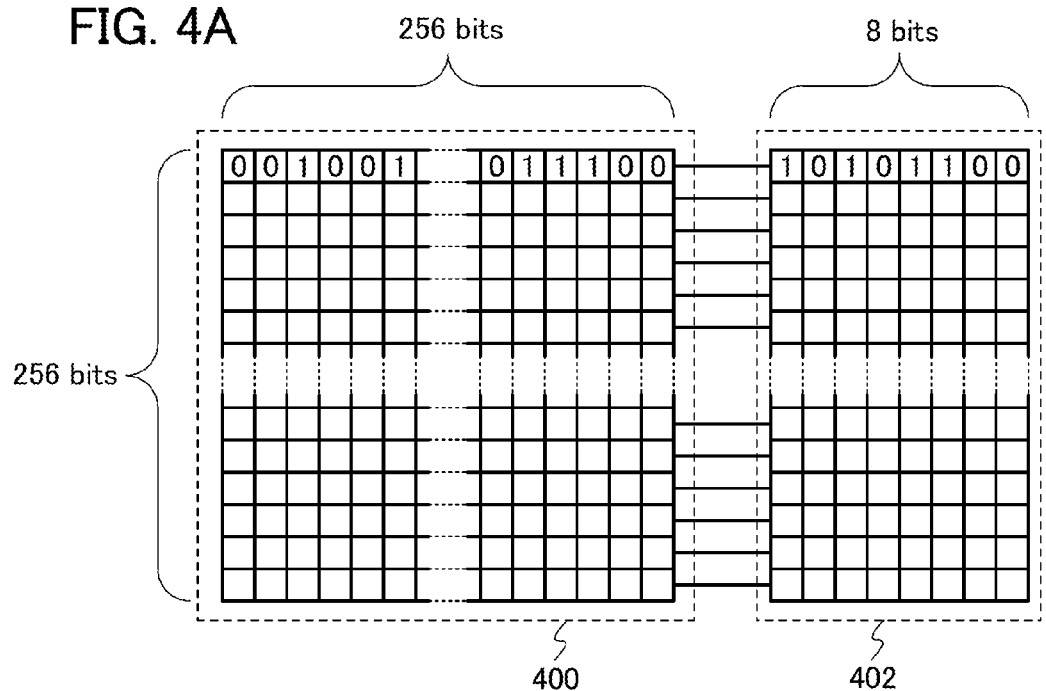
FIGS. 4A to 4C illustrate a configuration memory and a CRC memory of a semiconductor device which is one embodiment of the present invention.

Next, description is made on a method for driving a semiconductor device of one embodiment of the present invention, in which a CRC is performed. FIG. 4A illustrates the configuration memory 400 and a CRC memory 402 which are used in the driving method of a semiconductor device of one embodiment of the present invention. According to FIG. 4A, each row of the configuration memory is provided with a corresponding CRC memory. The CRC memory 402 has a capacitance equivalent to the number of rows multiplied by the number of bits of the CRC. That is, FIG. 4A shows an 8-bit CRC, and thus the CRC memory needs a capacitance equivalent to 256×8=2048 bits. Note that the number of bits of the CRC is not limited to 8.

The configuration memory 400 may include an SRAM or the like, or any of the memory elements described with reference to FIGS. 1A and 1B, FIG. 2, and FIGS. 3A and 3B.

The CRC memory 402 includes any of the memory elements described with reference to FIGS. 1A and 1B, FIG. 2, and FIGS. 3A and 3B.

Note that the configuration memory 400 and the CRC memory 402 may be separated by physical distance or provided close to each other. Alternatively, the CRC memory 402 may be stacked over the configuration memory 400.

Figure 4B:
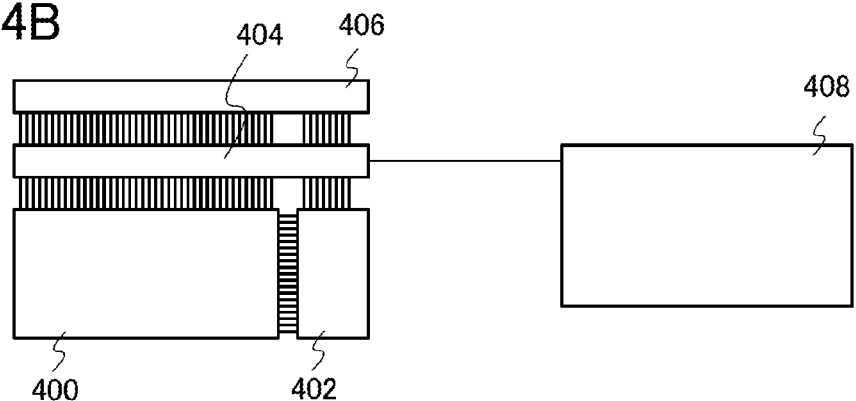

FIG. 4B illustrates other circuits and the like which are used for the CRC in addition to the configuration memory 400 and the CRC memory 402. Data is written to and read from the configuration memory 400 and the CRC memory 402 by a data input/output circuit 404. The data input/output circuit 404 allows data to be transmitted to and received from a CRC arithmetic circuit 406 and a boot memory 408.

Data to be written to the configuration memory 400 is stored in the boot memory 408. The boot memory 408 is preferably a non-volatile memory, for example, a memory device with low cost per bit such as a flash memory.

Note that at least the configuration memory 400, the CRC memory 402, the data input/output circuit 404, and the CRC arithmetic circuit 406 are provided on the same chip. The boot memory 408 may be provided on the same chip or provided externally; in the latter case, the boot memory 408 only needs to have a configuration allowing data to be transmitted to and received from the data input/output circuit 404.

Figure 4C:
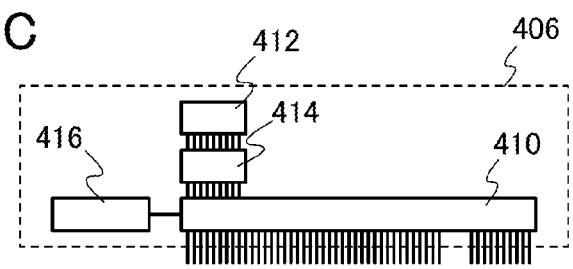

FIG. 4C is a schematic view of the CRC arithmetic circuit 406. The CRC arithmetic circuit 406 includes an input register 410, a divisor register 412, an arithmetic circuit 414, and a digit number counter 416.

A divisor necessary for a CRC is stored in the divisor register 412. In the case of an 8-bit CRC, for example, 9-digit data is stored. Here, the leftmost bit of the divisor register 412 is the most significant bit and "1" is input. Note that any of the memory elements illustrated in FIGS. 1A and 1B, FIG. 2, and FIGS. 3A and 3B may be used for the divisor register 412.

The arithmetic circuit 414 includes a plurality of XOR circuits, for example, 9 XOR circuits in the case of an 8-bit CRC, and executes an XOR operation using the upper 9-digit number of the input register 410 and the corresponding number of the divisor register 412. Note that in the case where such a plurality of XOR circuits (each having two inputs) are provided, a reduction in circuit area can be realized by using a 4-bit memory (preferably a read only memory (ROM)) and a plurality of multiplexers.

Although not illustrated, the CRC arithmetic circuit 406 includes other circuits used for arithmetic operation.

Execution process of the CRC will be specifically described below with reference to FIGS. 4B and 4C.

First, data of a row subjected to the CRC is input to the input register 410 from the configuration memory 400 and the CRC memory 402 via the data input/output circuit 404.

When the leftmost bit of the input register 410 is "0", data is shifted to the left and "1" is stored in the digit number counter 416. The rightmost bit is set to "0". This processing is repeated until the leftmost bit becomes "1". Each time data is shifted to the left, "1" is stored in the digit number counter 416, so that the number of times of shifting data (the number of digits) is stored in the digit number counter 416.

For example, data "00100110 . . ." is input to the input register 410; then, the input data is shifted to the left twice. As a result, the data input to the input register 410 becomes "100110 . . .". The number of digits shifted, "2", is stored in the digit number counter 416.

Then, in the arithmetic circuit 414, an XOR operation is executed using the upper 9-digit number of the input register 410 and the 9-digit number of the divisor register 412. After the arithmetic operation, the result is input to the upper 9 digits of the input register 410. Since the leftmost bit of the input register 410 is "0", data is shifted to the left and "1" is stored in the digit number counter 416. The rightmost bit is set to "0". This processing is repeated until the leftmost bit becomes "1".

After that, the arithmetic operation is performed again in the arithmetic circuit 414. This processing is repeated until the number stored in the digit number counter 416 becomes more than or equal to a predetermined number. For example, in the case where the configuration data is 256-bit data as illustrated in FIG. 4A, the above processing is repeated until the number stored in the digit number counter 416 becomes 256.

Then, the data in the input register 410 is determined. The data in the input register 410 is the remainder of the first number input to the input register 410. It is determined that there is no error if the remainder is 0, while it is determined that there is an error if the remainder is a number other then 0.

Note that one of the causes of errors in a memory is generally a failure in writing data. Such an error occurs at the same rate in an SRAM or the like and in the memory elements illustrated in FIGS. 1A and 1B, FIG. 2, and FIGS. 3A and 3B. Another cause of errors in a memory is a soft error. This error occurs at different rates in an SRAM or the like and in the memory elements illustrated in FIGS. 1A and 1B, FIG. 2, and FIGS. 3A and 3B. As described in Embodiment 1, soft errors are unlikely to occur in the memory elements illustrated in FIGS. 1A and 1B, FIG. 2, and FIGS. 3A and 3B as compared to an SRAM or the like.

Thus, errors can be dealt with on the assumption that they occur due to different causes, which leads to a reduction in unnecessary operations. That is, if an error occurs immediately after data writing, it can be considered as a failure in writing which has occurred in either or both of the configuration memory 400 and the CRC memory 402.

On the other hand, if an error occurs after the success of data writing, it is thought to be mainly caused by a soft error. In that case, only the data of the configuration memory 400 needs to be rewritten because the soft error occurs at a much higher rate in the configuration memory 400 than in the CRC memory 402, which allows efficient processing.

Figure 5:
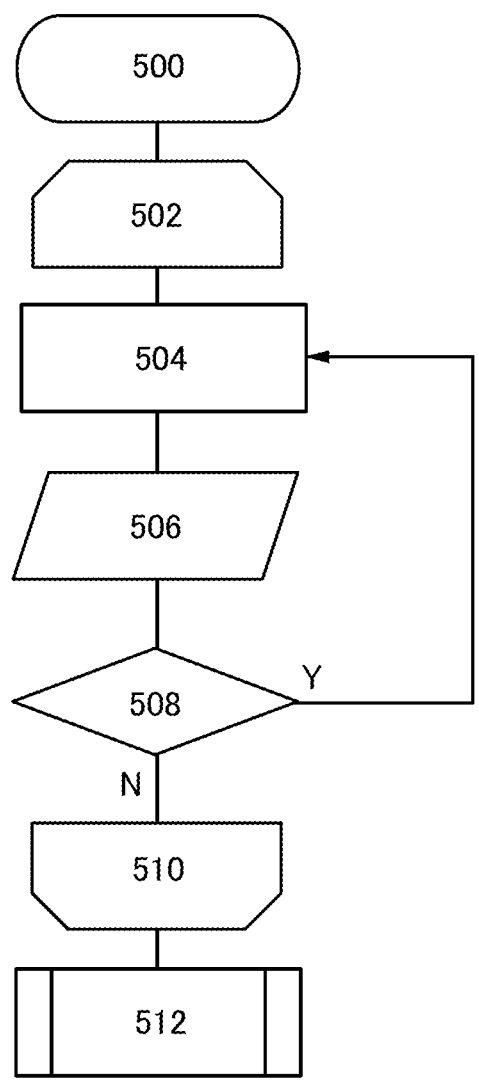
FIG. 5 is a first diagram illustrating a method for driving a semiconductor device which is one embodiment of the present invention.
Figure 6:
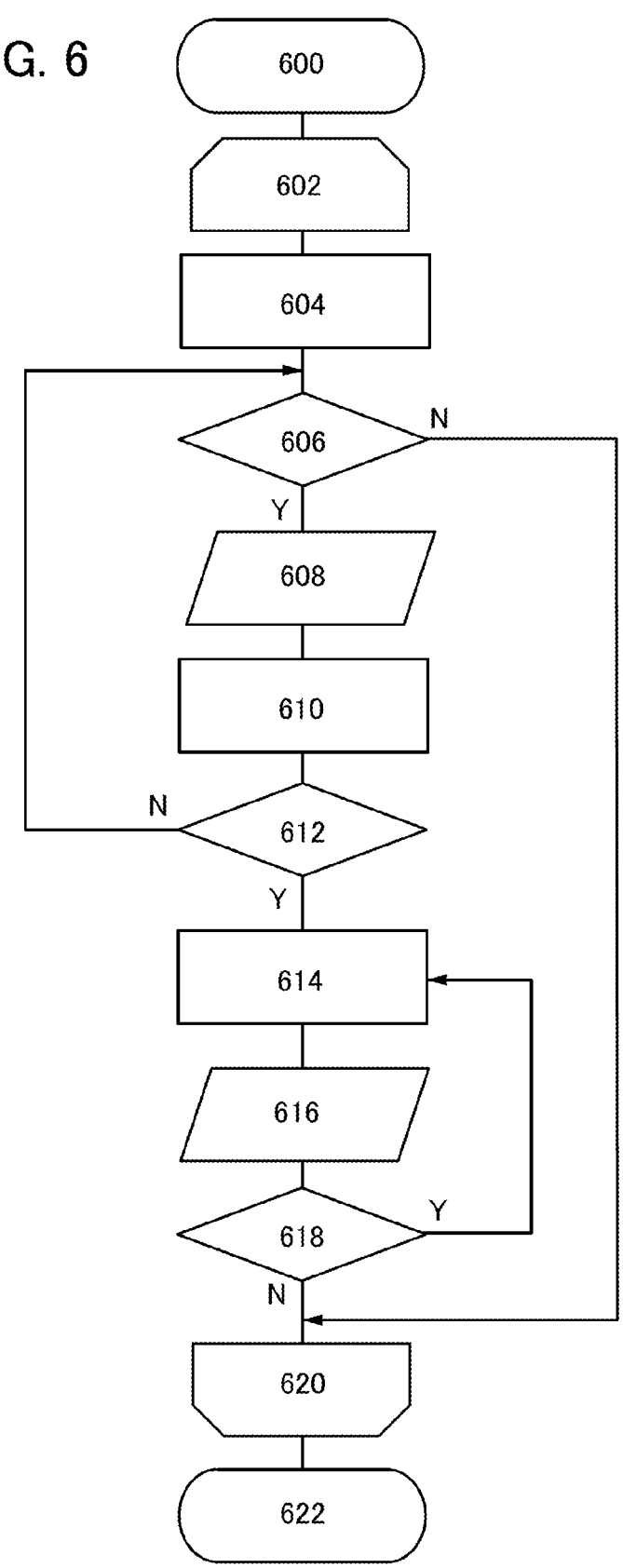
FIG. 6 is a second diagram illustrating a method for driving a semiconductor device which is one embodiment of the present invention.

Next, error check processing using a CRC of the method for driving a semiconductor device of one embodiment of the present invention will be described with reference to FIG. 5 and FIG. 6.

First, a configuration will be described with reference to FIG. 5. Here, the number of rows of a memory is n. First, processing is started (start 500), and a loop is started from i=1 (loop start 502).

Then, data of the i-th row is taken out from the boot memory 408 and a remainder is calculated (remainder calculation 504 of the i-th row). After the remainder calculation 504 of the i-th row, data to be input to the i-th row of the configuration memory 400 is input, and data of the calculated remainder is input to the i-th row of the CRC memory 402 (data writing 506 of the i-th row).

Next, an error is detected by a CRC (error detection 508 of the i-th row). The CRC is performed as follows: data of the i-th row of the CRC memory 402 is added to the end of data of the i-th row of the configuration memory 400, the sum is divided by a predetermined divisor, and it is determined whether the remainder is 0. If the remainder is 0, there is no error (branch to N), and there is an error if the remainder is a number other than 0 (branch to Y). In the case where there is no error, the next row is processed. In the case where there is an error, it is determined that a failure in writing has occurred in either the configuration memory 400 or the CRC memory 402, and the remainder calculation 504 of the i-th row, the data writing 506 of the i-th row, and the error detection 508 of the i-th row are performed again and repeated until no error is detected.

The above-mentioned processes are repeated from i=1 to n, and the loop is completed (loop end 510). After the loop end 510, the configuration is completed and transferred to a user mode (processing transfer 512).

Next, a user mode will be described with reference to FIG. 6. Here, the number of rows of a memory is n as in FIG. 5. First, processing is started (user mode start 600), and a loop is started from i=1 (loop start 602).

Note that as described below, in the user mode, the remainder is calculated again if it is determined that there is an error a predetermined number of times or more. Here, the number of times an error is detected is k, and the maximum number of times corresponding to the above predetermined number of times is m. Immediately after the loop start 602, 1 is input to k ("k=1" 604).

Then, an error is detected by a CRC (error detection 606 of the i-th row). The CRC is performed in a manner similar to that of FIG. 5. If there is no error (branch to N), the next row is processed. If there is an error (branch to Y), data to be input to the i-th row of the configuration memory 400 is input (data writing 608 of the i-th row), and 1 is added to k ("k+1" 610). At this time, the data of the i-th row of the CRC memory 402 is kept as it is.

Then, it is determined whether an error is detected the maximum number of times, namely, whether k=m ("determination of k=m" 612). In the case where k=m is not satisfied (that is, in the case where the number of times an error is detected does not reach the maximum number of times), the error detection 606 of the i-th row is performed again. In the case where k=m is satisfied (that is, in the case where the number of times an error is detected reaches the maximum number of times), the data of the i-th row is read out from the boot memory 408 and the remainder is calculated (remainder calculation 614 of the i-th row). After the remainder calculation, the data to be input is input to the i-th row of the configuration memory 400 and the calculated remainder is input to the i-th row of the CRC memory 402 (data writing 616 of the i-th row); then, an error is detected again by the CRC (error detection 618 of the i-th row). If there is no error (branch to N), the next row is processed. If there is an error (branch to Y), the remainder calculation 614 of the i-th row is performed again and the above processing is repeated until no error is detected.

Note that the loop from the remainder calculation 614 of the i-th row to the error detection 618 of the i-th row may also have a maximum number of times. If the number of times of the loop reaches the maximum number of times, an error might be caused by a factor other than the above possible factors; accordingly, operation of some or all of the circuits in the semiconductor device may be stopped.

In addition, it is also possible to determine a period from the beginning of an error check of a certain row to the beginning of an error check of the next row. For example, if the period between the beginning and the end of an error check of a certain row is shorter than the predetermined period, an error check of the next row is started after the predetermined period has elapsed from the beginning of an error check of a certain row. On the other hand, if the period between the beginning and the end of an error check of a certain row is longer than or equal to the predetermined period, an error check of the next row is started immediately.

The processing is repeated for i=1 to n; then, the loop is completed (loop end 620). After the loop end, the processing is completed (end 622).

As described above, a CRC can be performed in the method for driving a semiconductor device of one embodiment of the present invention. In a conventional CRC, a remainder needs to be calculated also in a user mode. In the driving method of one embodiment of the present invention, a remainder is calculated in a user mode only when an error is detected a predetermined number of times or more, which is one of the main features of one embodiment of the present invention. Accordingly, the entire processing can be simplified.

Note that in the above processing, upset of a divisor used for calculating a remainder needs to be avoided. Hence, the divisor is preferably stored in a ROM provided inside or outside the semiconductor device. In the configuration, the divisor may be read out from the ROM to be used for calculating a remainder. The data read out in the configuration is preferably stored in any of the memory elements described with reference to FIGS. 1A and 1B, FIG. 2, and FIGS. 3A and 3B.

The above processing is performed in a semiconductor device, a computer, a processor, or the like with use of a computer program stored in a read only memory which is provided inside or outside the semiconductor device. Note that the computer program is transmitted or received through a communication line in some cases. In other cases, the computer program is transmitted as needed, or relayed through a server or the like.

This application is based on Japanese Patent Application serial No. 2012-100190 filed with Japan Patent Office on Apr. 25, 2012, the entire contents of which are hereby incorporated by reference.

What is claimed is:

1. A semiconductor device comprising:
   a configuration memory, and
   a cyclic redundancy check memory comprising a plurality of memory elements being in a matrix, each memory element including:
      a plurality of transistors;
      a capacitor; and
      a data storage portion configured to store data for an error detection,
   wherein the data storage portion includes one of a source and a drain of first one of the plurality of transistors, a gate of second one of the plurality of transistors, and a first electrode of the capacitor,
   wherein the cyclic redundancy check memory has a lower error rate than the configuration memory, and
   wherein the semiconductor device is configured to conduct:
      calculating a remainder;
      storing the remainder in the cyclic redundancy check memory;
      detecting an error of an i-th row with use of the remainder by a cyclic redundancy check;
      performing processing of an i+1-th row if there is no error in the i-th row;
      writing data to be input to the i-th row which is stored in the configuration memory if there is an error in the i-th row; and
      repeating the step of detecting an error and the step of writing data until no error is detected.

2. The semiconductor device according to claim 1, wherein an active layer in the first one of the plurality of transistors has a thickness of 20 nm or less.

3. The semiconductor device according to claim 1, wherein one of a source and a drain of the second one of the plurality of transistors is connected to one of a source and a drain of third one of the plurality of transistors.

4. The semiconductor device according to claim 1, wherein a second electrode of the capacitor is connected to one of a source and a drain of fourth one of the plurality of transistors.

5. The semiconductor device according to claim 1, wherein the data storage portion further includes a gate of third one of the plurality of transistors.

6. The semiconductor device according to claim 1, wherein the capacitor has a capacitance of 1 fF or more.

7. A method for driving a semiconductor device comprising the steps of:
   calculating a remainder;
   storing the remainder in a cyclic redundancy check memory;
   detecting an error of an i-th row with use of the remainder by a cyclic redundancy check;
   performing processing of an i+1-th row if there is no error in the i-th row;
   writing data to be input to the i-th row which is stored in a configuration memory if there is an error in the i-th row; and
   repeating the step of detecting an error and the step of writing data until no error is detected,
   wherein the cyclic redundancy check memory has a lower error rate than the configuration memory.

8. The method for driving a semiconductor device, according to claim 7, wherein data of the i-th row is taken out from a boot memory when calculating the remainder.

9. The method for driving a semiconductor device, according to claim 7, wherein the cyclic redundancy check is performed by the steps of:
   adding data of the i-th row of the cyclic redundancy check memory to end of data of the i-th row of the configuration memory;
   dividing a sum of the data of the i-th row of the cyclic redundancy check memory to the end of the data of the i-th row of the configuration memory by a predetermined divisor; and
   determining whether the remainder is 0.

10. The method for driving a semiconductor device, according to claim 7, wherein in the case where the step of detecting an error with use of the remainder is repeated a predetermined number of times or more, the remainder is calculated again.

11. The method for driving a semiconductor device, according to claim 7, wherein a divisor used for calculating the remainder is stored in a ROM.

12. The method for driving a semiconductor device, according to claim 7, wherein the cyclic redundancy check memory is provided in the semiconductor device comprising:
   a plurality of memory elements being in a matrix, each memory element including:
      a plurality of transistors;
      a capacitor; and
      a data storage portion configured to store data for an error detection,
   wherein the data storage portion includes one of a source and a drain of first one of the plurality of transistors, a gate of second one of the plurality of transistors, and a first electrode of the capacitor, and
   wherein the first one of the plurality of transistors comprises an oxide semiconductor layer.

13. A readable memory device storing a computer program for detecting an error in a memory of a semiconductor device, when the computer program is executed in the semiconductor device or a processor, the semiconductor device or the processor conducting the steps of:
   calculating a remainder;
   storing the remainder in a cyclic redundancy check memory;
   detecting an error of an i-th row with use of the remainder by a cyclic redundancy check;
   performing processing of an i+1-th row when there is no error in the i-th row;
   writing data to be input to the i-th row which is stored in a configuration memory when there is an error in the i-th row; and
   repeating the step of detecting an error and the step of writing data until no error is detected, wherein the cyclic redundancy check memory has a lower error rate than the configuration memory.

14. The readable memory device according to claim 13, wherein data of the i-th row is taken out from a boot memory when calculating the remainder.

15. The readable memory device according to claim 13, wherein the cyclic redundancy check is performed by the steps of:
- adding data of the i-th row of the cyclic redundancy check memory to end of data of the i-th row of the configuration memory;
- dividing a sum of the data of the i-th row of the cyclic redundancy check memory to the end of the data of the i-th row of the configuration memory by a predetermined divisor; and
- determining whether the remainder is 0.

16. The readable memory device according to claim 13, wherein a divisor used for calculating the remainder is stored in a ROM.

17. The readable memory device according to claim 13, wherein the cyclic redundancy check memory is provided in the semiconductor device comprising:
- a plurality of memory elements being in a matrix, each memory element including:
- a plurality of transistors;
- a capacitor; and
- a data storage portion configured to store data for an error detection,
- wherein the data storage portion includes one of a source and a drain of first one of the plurality of transistors, a gate of second one of the plurality of transistors, and a first electrode of the capacitor, and
- wherein the first one of the plurality of transistors comprises an oxide semiconductor layer.

18. The semiconductor device according to claim 1, wherein the first one of the plurality of transistors comprises an oxide semiconductor layer.

* * * * *